(12) United States Patent
Ebe et al.

(10) Patent No.: US 7,015,498 B2
(45) Date of Patent: Mar. 21, 2006

(54) QUANTUM OPTICAL SEMICONDUCTOR DEVICE

(75) Inventors: Hiroji Ebe, Kawasaki (JP); Yoshiaki Nakata, Kawasaki (JP); Mitsuru Sugawara, Kawasaki (JP); Takashi Kita, Kadoma (JP); Osamu Wada, Kobe (JP); Yasuhiko Arakawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/662,819

(22) Filed: Sep. 16, 2003

(65) Prior Publication Data
US 2004/0124409 A1   Jul. 1, 2004

(30) Foreign Application Priority Data
Sep. 19, 2002   (JP) .............................. 2002-273178

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. ........................................ 257/14; 438/962
(58) Field of Classification Search ................. 257/14, 257/15, 16, 17, 18, 19, 23, 25, 26, 20, 21; 438/962, 108; 977/DIG. 1
See application file for complete search history.

(56) References Cited

U.S. PATENT DOCUMENTS

| | | | | |
|---|---|---|---|---|
| 6,751,243 B1 * | 6/2004 | Mukai | ........................ | 372/45 |
| 2002/0119680 A1 * | 8/2002 | Wang et al. | ................ | 438/962 |
| 2002/0162995 A1 * | 11/2002 | Petroff et al. | ................ | 257/21 |

FOREIGN PATENT DOCUMENTS

JP    9-326506    12/1997

OTHER PUBLICATIONS

D. Leonard et al.; "Direct formation of quantum-sized dots from uniform coherent islands of InGaAs on GaAs surfaces"; *Applied Physics Letters*; vol. 63; No. 23; Dec. 6, 1993; pp. 3203-3205./Discussed in the specification.

K. Mukai et al.; "Self-Formed $In_{0.5}Ga_{0.5}As$ Quantum Dots on GaAs Substrates Emitting at 1.3 $\mu m$"; *Japanese Journal of Applied Physics'* vol. 33; Part 2, No. 12A; Dec. 1, 1994; pp. L1710-L1712./Discussed in the specification.

J. Oshinowo et al.; "Highly uniform InGaAs/GaAs quantum dots (~15 nm) by metalorganic chemical vapor deposition"; *Applied Physics Letters*; vol. 65; No. 11; Sep. 12, 1994; pp. 1421-1423./Discussed in the specification.

* cited by examiner

*Primary Examiner*—Hoai Pham
*Assistant Examiner*—Dana Farahani
(74) *Attorney, Agent, or Firm*—Armstrong, Kratz, Quintos, Hanson & Brooks, LLP

(57) ABSTRACT

A quantum semiconductor device including quantum dots formed by S-K growth process taking place in a heteroepitaxial system wherein the relationship between the energy level of light holes and the energy level of heavy holes in the valence band is changed by optimizing the in-plane strain and the vertical strain accumulated in a quantum dot.

18 Claims, 12 Drawing Sheets

FIG.3
10
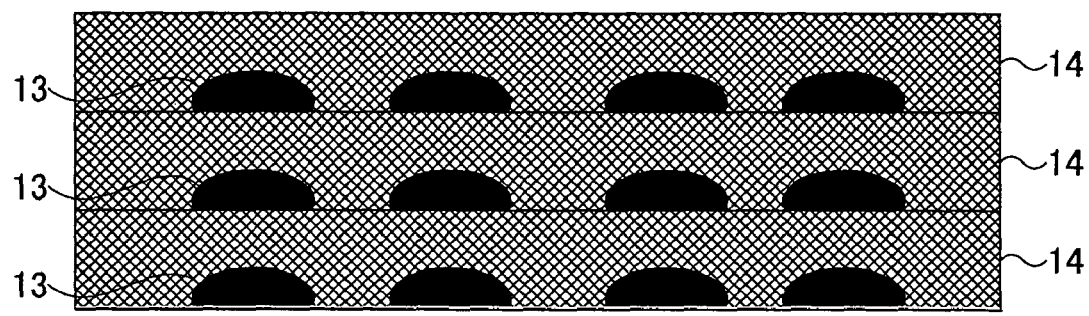
.....
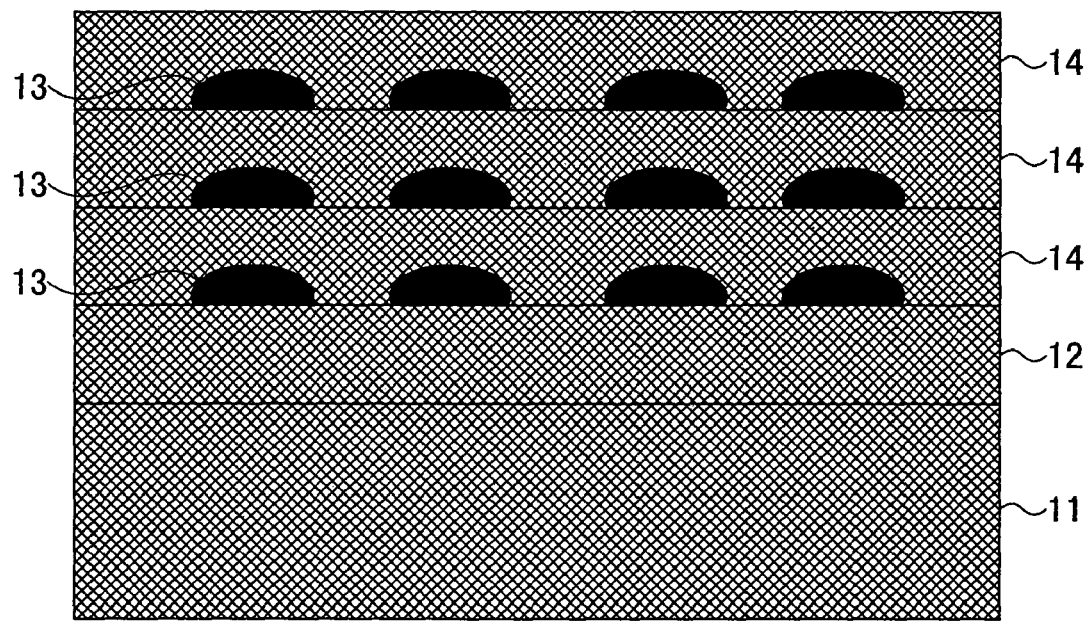

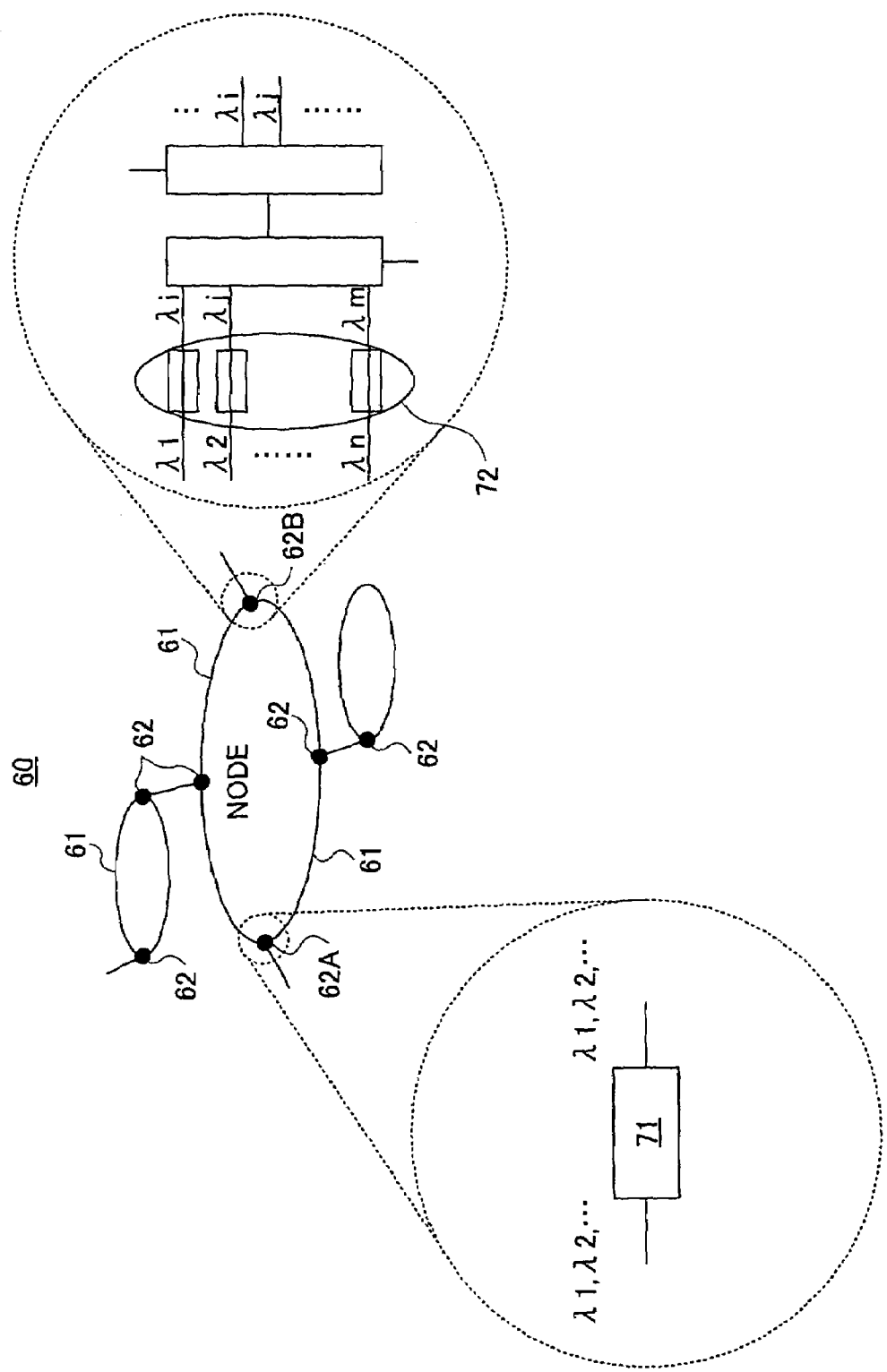

QUANTUM OPTICAL SEMICONDUCTOR DEVICE

CROSS-REFERENCE TO RELATED APPLICATION

The present application is based on Japanese priority application No. 2002-273178 filed on Sep. 19, 2002, the entire contents of which are hereby incorporated by reference.

BACKGROUND OF THE INVENTION

1. Field of the Invention

The present invention generally relates to semiconductor devices and more particularly to a quantum optical semiconductor device having a quantum dot structure therein.

2. Description of the Related Art

In a bulk semiconductor crystal where there is no carrier confinement, the state density of the carriers increases continuously with energy in the form of parabolic curve. In a quantum well structure in which there exists one-dimensional carrier confinement, on the other hand, there appear quantum levels as a result of such a one-dimensional carrier confinement, and the state density is changed to have a stepwise form that changes stepwise with energy in correspondence to the quantum levels that characterize the quantum well structure.

Because of the stepwise state density, the carriers experience restriction with regard to the energy distribution in such a system, and thus, the use of a quantum well structure in an optical semiconductor device such as a laser diode leads to an advantageous feature of sharp and narrowly confined optical spectrum, which is superior to the spectrum of a laser diode that uses a bulk semiconductor crystal. In the case of light-emitting devices including laser diodes, the use of a quantum well structure further provides improvement in the efficiency of optical emission. Further, a quantum well structure can be used also as an energy filter in electron devices having a resonant tunneling barrier such as RHET (resonant hot-electron transistor).

In the quantum-well wire structure in which the degree of carrier confinement is increased further, the state density is changed further, because of the existence of the two-dimensional carrier confinement, such that there appears a maximum of state density in each of the steps at the bottom edge thereof. As a result, the sharpness of the energy spectrum of the carriers is increased further.

In the ultimate quantum dot structure in which the degree of carrier confinement is increased further, there appears a discrete state density distribution as a result of the three-dimensional carrier confinement, and associated with thus, the energy spectrum of the carriers becomes totally discrete in correspondence to the discrete quantum levels.

In the system having such a discrete energy spectrum, transition of carriers occurs discontinuously from a quantum level to another quantum level, even in case the system is held in a room temperature environment where there are caused plenty of thermal excitations. Thus, by using such a quantum dot structure, it becomes possible to realize an optical semiconductor device having a very sharp spectrum even in the case the device is operated in the room temperature environment. Further, the use of such a quantum dot structure realizes a very sharp energy spectrum in an electron device having a resonant-tunneling barrier not only at low temperatures but also at the room temperature in the case the quantum dot structure is used for the energy filter.

Further, quantum dot structures draw attention also in the field of fundamental physics in relation to the bottleneck problem of energy relaxation.

Conventionally, a quantum well structure has been formed relatively easily by forming a very thin quantum well layer by an MBE process or MOVPE process such that the quantum well layer is sandwiched between a pair of barrier layers. In the case of forming a quantum-well wire structure, there is proposed a process of growing a semiconductor layer on a so-called inclined semiconductor substrate having a stepped surface such that the semiconductor layer is grown in each of the steps from the step edge with a limited width and limited thickness. Alternatively, a quantum-well wire structure may be formed by forming a one-dimensional quantum well structure by way of electron-beam lithography.

Thus, one may be motivated to form a quantum-dot structure also on an inclined semiconductor substrate by utilizing the surface steps on the substrate, similarly to the case of the quantum-well wire structure. However, such an approach of extrapolating the conventional process encounters various problems such as difficulty of controlling the steps on such a substrate surface, occurrence of mixing of elements at the quantum-dot interface, and the like. When there is caused a mixing of elements, the desired sharp change of composition is not attained at the quantum-dot surface. Further, the use of a patterning process such as lithography for forming the quantum dot inevitably causes substantial damages in the quantum dot.

Meanwhile, there has been proposed a process of forming quantum dots on a substrate in the form of mutually isolated islands by utilizing S-K (Stranski-Krastanow) mode growth, which appears in the initial phase of heteroepitaxial growth caused in a strained heteroepitaxial system such as the InAs/GaAs system.

For example, there is a report (Leonard, D. et al., Appl. Phys. Lett. 63, pp. 3203–3205, 1993) of successful formation of islands of InGaAs on a GaAs substrate with a diameter of 30–40 nm, by growing an InGaAs layer having an In content of about 0.5 on a GaAs substrate, which has a lattice constant substantially different from the lattice constant of the InGaAs layer.

Further, there is a report (Mukai, K., et al., Jpn. J. Appl. Phys. 33, pp. L1710–L1712, 1994) of forming islands of InGaAs on a GaAs substrate with a diameter of 15–20 nm by using an ALE process such that the InGaAs islands are separated from each other with an interval of about 100 nm.

Further, it is reported that similar quantum dots can be formed also by an MOVPE process (Oshinowo, J., et al., Appl. Phys. Lett. 65, (11), pp. 1421–1423 (1994).

Because such formation of quantum dots in a strained heteroepitaxial system is controlled by the strain energy formed at the heterointerface, the formation of the quantum dots is much more simpler than the conventional process of forming the quantum dots. Further, because the process does not use any patterning process such as an electron-beam lithography, there occurs no such a problem that the obtained quantum dots are damaged during the formation process.

Because the foregoing S-K mode growth relies upon the use of lattice-mismatched material system, a quantum dot formed by the S-K mode growth generally accumulates therein a non-uniform strain characterized by an in-plane compressive strain. Further, the quantum dot accumulates a tensile strain or weak compressive strain in the growth direction.

FIG. 1 shows the construction of a quantum semiconductor device disclosed in the Japanese Laid-Open Patent Publication 9-326506 that uses quantum dots formed by the S-K mode growth process.

Referring to FIG. 1, a number of InAs quantum dots $3b$ are formed on a GaAs substrate 1 having a (100)-oriented surface via a GaAs buffer layer 2 by the S-K mode growth process, wherein the InAs quantum dots $3b$ are formed in plural layers on the GaAs substrate 1 and are embedded in a GaAs intermediate layer or barrier layer $3a$ in each of the layers. Further, the quantum dots $3b$ of the next layer are grown on the barrier layer $3a$ burying the quantum dots $3b$ underneath.

In the example of FIG. 1, each of the quantum dots $3b$ induces a severe strain in the barrier layer $3a$ covering the quantum dot $3b$ particularly at the part contacting the apex part of the quantum dot $3b$, and as a result, each quantum dot $3b$ of the next layer tends to grow on the barrier layer $3a$ in the part immediately above an underlying quantum dot $3b$. Thus, there is achieved an alignment of the quantum dots $3b$ in the direction perpendicular to the surface of the substrate 1 in the case the growth of the barrier layer $3a$ and the quantum dots $3b$ is conducted repeatedly.

Thus, by using the quantum semiconductor structure of FIG. 1, it is possible to construct a quantum optical semiconductor device such as a laser diode, optical amplifier, optical switch, wavelength conversion element, and the like, that constitutes an all-optical network or so-called photonic network.

In the case of using such a quantum optical semiconductor device in a photonic network, it should be noted that the quantum optical semiconductor device is required to have a polarization-free characteristics in view of the polarization-free nature of the optical signals transmitted over the optical fibers.

In the case of the quantum dots that uses the S-K mode growth as explained with reference to FIG. 1, on the other hand, the quantum dots have generally a flat shape and accumulate non-isotropic strain therein as noted before, and because of this, construction of optical semiconductor devices has been successful only in the case the optical semiconductor device is the one that amplifies or emits the optical beam of TE mode, as long as the quantum dots formed by the S-K process are used for the active part of the optical semiconductor device. Thus, it has been difficult to construct a polarization-free device, which is required in the actual optical network systems.

In more detail, a non-isotropic strain applied to a quantum dot induces separation of a heavy hole level from a light hole level in the hole level constituting the valence band, and because of this, there appears an energy difference $\Delta E_{l-h}$ between the light hole level and the heavy hole level as $$\Delta E_{l-h} \approx -2b(\epsilon_{zz} - \epsilon_{xx}) \quad (1)$$

wherein b is a negative constant called uniaxial deformation potential while $\epsilon_{xx}$ and $\epsilon_{zz}$ represent respectively the in-plane strain component acting in the direction parallel to the substrate and a strain component acting perpendicular to the substrate surface. In Eq. (1), the positive value of the strain $\epsilon_{zz}$ or $\epsilon_{xx}$ represents a tensile strain while the negative value represents a compressive strain.

Thus, in the case of the conventional quantum dots that accumulates a compressive strain in the in-plane direction, the energy difference $\Delta E_{l-h}$ takes a positive value and thus, the energy difference between the electron level and the heavy hole level becomes smaller than the energy difference between the electron level and the light hole level. As a result, there occurs optical transition between the heavy hole level and the electron level forming the conduction band as represented in FIG. 2.

Meanwhile, it should be noted that such optical transition occurs in the quantum dot only in the case the electric field component of the incoming optical radiation has a direction perpendicular to the wave vector k of the electron waves in the quantum dot. In a flat quantum dot formed by the S-K growth process, it should be noted that quantization of electrons is caused mainly for the electron wave component perpendicular to the substrate surface, and thus, the wave vector k of the electron wave becomes perpendicular to the substrate surface.

Thus, in the quantum dot formed by the S-K mode growth, the interaction between the incoming optical radiation and the electron wave occurs only in the case the incoming optical radiation is a TE-mode optical beam characterized by the electric field parallel to the substrate surface.

Thus, quantum optical semiconductor devices that use quantum dots formed by the S-K mode growth process generally show remarkable polarization dependence, and because of this, it has been difficult to construct a photonic network, which requires polarization-free optical characteristics for the components constituting the network, by using such conventional quantum optical semiconductor devices unless an additional optical system is provided for compensating for the polarization-dependence of the quantum dots. However, such an additional optical system is complex and increases the cost of the optical network.

SUMMARY OF THE INVENTION

Accordingly, it is a general object of the present invention to provide a novel and useful quantum semiconductor device wherein the foregoing problems are eliminated.

Another and more specific object of the present invention is to provide a quantum semiconductor device having a quantum dot formed by an S-K mode growth process wherein the polarization dependence is eliminated.

Another object of the present invention is to provide a quantum semiconductor device having a quantum dot formed by an S-K mode growth process and yet capable of operating on the optical radiation of TM-mode.

Another object of the present invention is to provide a quantum optical semiconductor device, comprising:

a semiconductor substrate; and an active layer formed on said semiconductor substrate and including therein a quantum structure, said quantum structure comprising:

a first barrier layer of a first semiconductor crystal having a first lattice constant and a first bandgap;

a second barrier layer of a second semiconductor crystal formed epitaxially on said first barrier layer, said second semiconductor crystal having a second lattice constant and a second bandgap;

a plurality of quantum dots formed in said second barrier layer, each of said quantum dots comprising a semiconductor crystal forming a strained system with regard to said first and second semiconductor crystals and having a lattice constant different from said first lattice constant and a bandgap smaller than any of said first and second bandgaps, each of said quantum dots having a height substantially identical with a thickness of said second barrier layer; and a third barrier layer of a third semiconductor crystal formed on said second barrier layer, said third semiconductor crystal having a lattice constant different from said lattice constant of said semiconductor crystal constituting said quantum dot, said third semiconductor crystal further having a third bandgap larger than said bandgap of said semiconductor crystal forming said quantum dot, said third barrier layer making a contact with an apex of said quantum dot formed in said second barrier layer.

Another object of the present invention is to provide a quantum optical semiconductor device, comprising:

a semiconductor substrate; and an active layer formed on said semiconductor substrate and including a quantum structure therein, said quantum structure comprising:

a first barrier layer of a first semiconductor crystal having a first lattice constant and a first bandgap;

a second barrier layer of a second semiconductor crystal formed epitaxially on said first barrier layer, said second semiconductor crystal having a second lattice constant and a second bandgap;

a plurality of quantum dots formed in said second barrier layer, each of said quantum dots comprising a semiconductor crystal forming a strained system with respect to said first and second semiconductor crystals and having a lattice constant different from said first lattice constant and a bandgap smaller than any of said first and second bandgaps, each of said quantum dots having a height substantially equal to a thickness of said second barrier layer, said first barrier layer and said second barrier layer being stacked alternately such that said first barrier layer makes a contact with an apex of said quantum dot in said second barrier layer, said first barrier layer and said second barrier layer having respective, different compositions.

In the quantum dot structure of the present invention, the interaction of the quantum dot structure to the optical radiation of TM-mode has a proportion equal to or larger than the interaction to the optical radiation of the TE-mode.

Another object of the present invention is to provide a quantum optical semiconductor device, comprising:

a semiconductor substrate; and an active layer formed on said semiconductor substrate and including a quantum structure therein, said quantum structure comprising:

a barrier layer of a first semiconductor crystal having a first lattice constant and a first bandgap;

a plurality of quantum-dots formed in said barrier layer, each of said quantum dots comprising a semiconductor crystal forming a strained system with respect to said first semiconductor crystal and having a lattice constant different from said first lattice constant and a bandgap smaller than said first bandgap, said barrier layer containing therein said plurality of quantum dots being staked for a predetermined stack number, wherein said predetermined stack number is set such that a proportion of interaction of said quantum dots to optical radiation of TM-mode is equal to or larger than a proportion of interaction of said quantum dots to optical radiation of TE-mode.

According to the present invention, optimization is achieved with regard to the strain components acting upon the quantum dots in the in-plane direction and also in the direction perpendicular to the semiconductor substrate, such that there is realized the relationship $\epsilon_{zz} < \epsilon_{xx}$ in the foregoing Eq. (1). Thereby, the term $\Delta E_{l-h}$ becomes negative, and thus, the level of the light holes now becomes the fundamental state of the quantum dot for the holes.

In such quantum dots, optical excitation occurs between the light-hole level and the electron level, and the quantum dots having such optimized strain cause interaction predominantly with the optical radiation of the TM-mode.

Thus, by forming a quantum optical semiconductor device such that the quantum optical semiconductor device includes therein the quantum dots interacting predominantly with the TM-mode optical radiation in addition to the quantum dots interacting predominantly with the TE-mode optical radiation, or alternatively, by optimizing the strain in each quantum dot such that there occurs interaction to the TM-mode optical radiation in the same proportion with the interaction to the TE-mode optical radiation, it becomes possible to realize an optical semiconductor device free from polarization dependence and thus suitable for use in optical network, and the like.

Other objects and further features of the present invention will become apparent from the following detailed description when read in conjunction with the attached drawings.

BRIEF DESCRIPTION OF THE DRAWINGS

FIG. 3 is a diagram showing the construction of a quantum semiconductor device according to a first embodiment of the present invention;

FIG. 12 is a diagram showing an example of a photonic network according to a sixth embodiment of the present invention.

DETAILED DESCRIPTION OF THE INVENTION

[First Embodiment]

Figure 1:
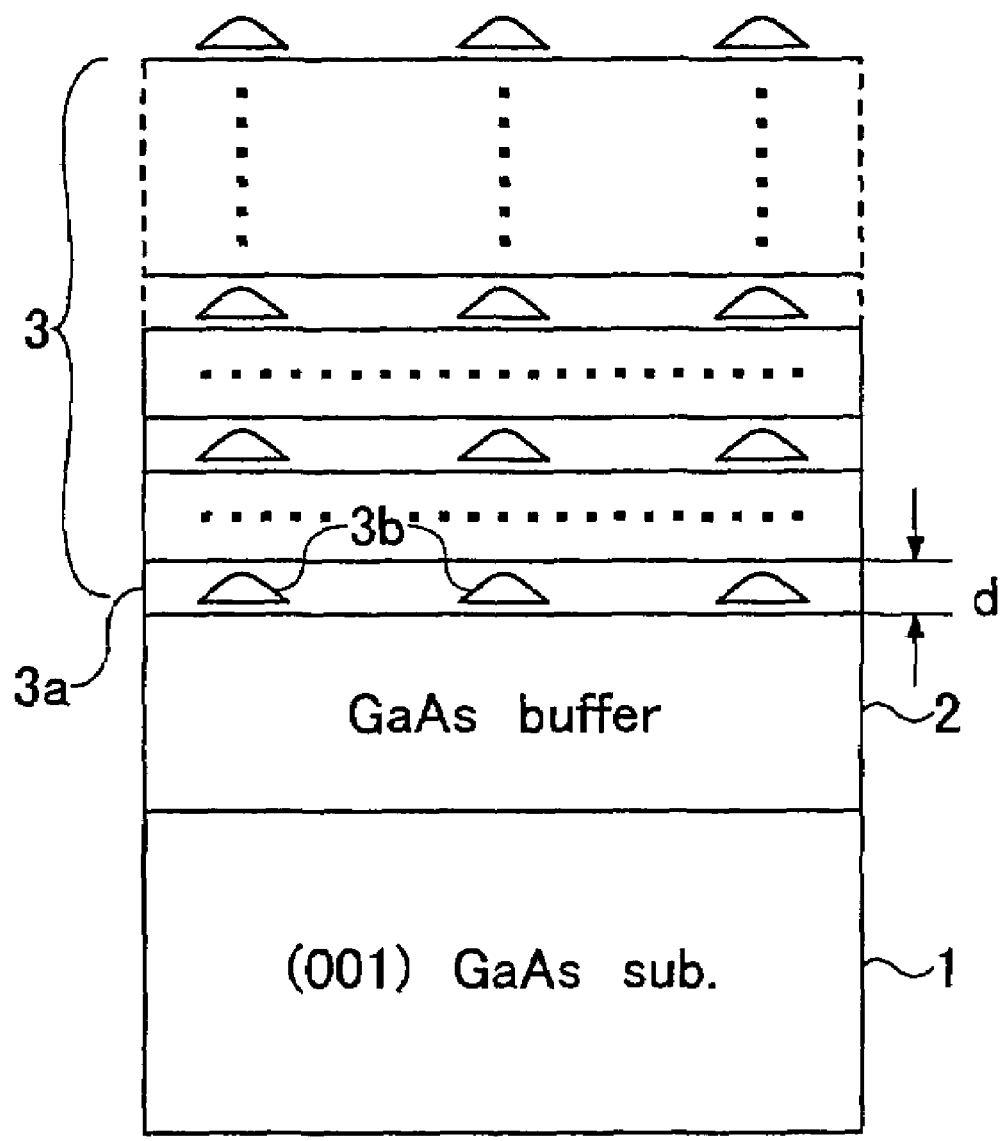
FIG. 1 is a diagram showing the construction of a quantum semiconductor device having the quantum dots formed by conventional S-K mode growth process.

FIG. 3 shows the construction of a quantum optical semiconductor device 10 according to a first embodiment of the present invention.

Referring to FIG. 3, a GaAs buffer layer 12 is formed on a GaAs substrate 11 having a (100)-surface orientation, and an InAs layer is formed on the GaAs buffer layer 12 by an MOVPE process at a substrate temperature of 510° C. with a source supply rate set such that there is formed an InAs layer with a thickness of about 1.8 molecular layers.

It should be noted that the InAs layer thus formed experiences compressive strain due to the fact that the lattice constant of InAs crystal is larger than the lattice constant of the GaAs substrate, and as a result, there are formed islands of InAs quantum dots 13 on the GaAs buffer layer 12 as a result of the S-K mode growth. Thereby, the InAs quantum dots 13 form a strained heteroepitaxial system together with the underlying GaAs buffer layer 12. It should be noted that such InAs quantum dots 13 can be formed also by an MBE process.

Further, a GaAs barrier layer 14 is grown on such a structure by an MOVPE process with a thickness of about three molecular layers, and as a result, the quantum dots 13 are embedded in the barrier layer 14.

Further, a next InAs layer is grown on the barrier layer 14 by an MOVPE process with a source supply rate set such that there is formed an InAs layer with a thickness of about 0.7 molecular layers. Thereby, the next InAs quantum dots 13 are formed on the InAs barrier layer 14 as a result of the similar S-K growth process.

By forming the next barrier layer 14 so as to cover the quantum dots 13 and further repeating the formation of the next quantum dots, one obtains the desired quantum structure.

Figure 4A:
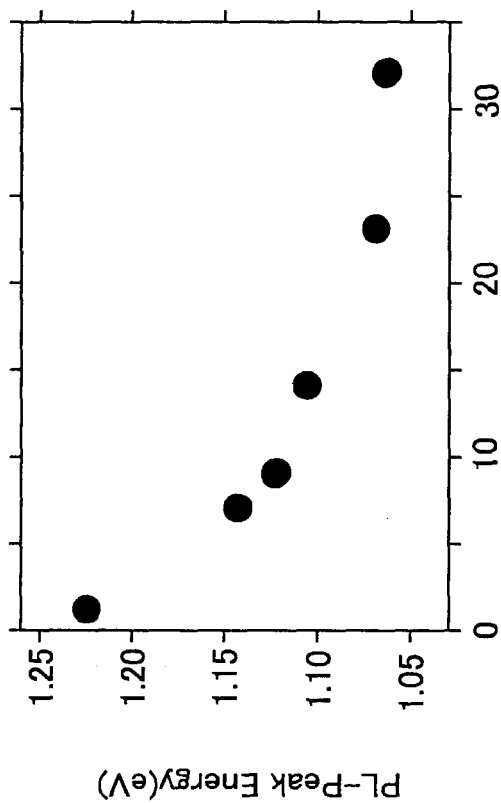
FIGS. 4A and 4B are diagrams showing the PL energy and TE/TM mode ratio in the quantum semiconductor device of FIG. 3.
Figure 4B:
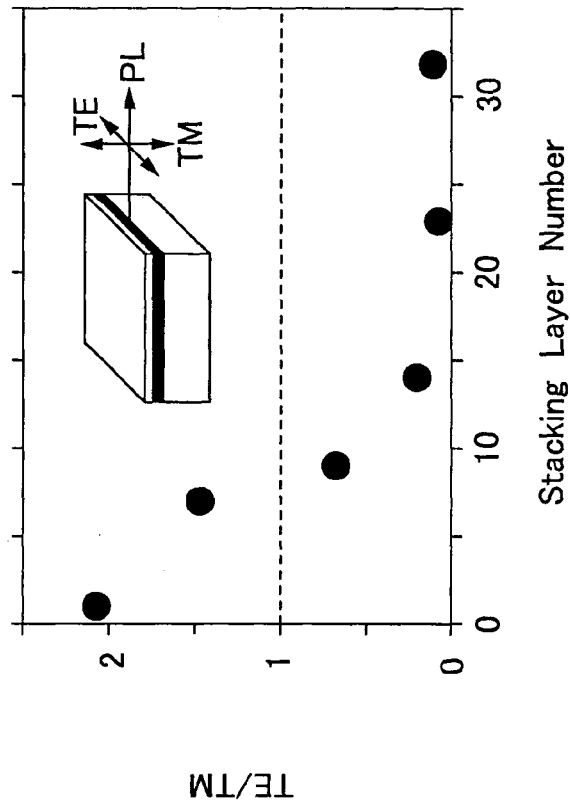

FIGS. 4A and 4B respectively show the PL (photoluminescence) peak energy and PL intensity ratio TE/TE for the fundamental state of the quantum optical semiconductor device 10 of FIG. 3 as a function of the number of stacks, wherein the TE/TM ratio represents the ratio of the TE-mode PL intensity to the TM-mode PL intensity. It should be noted that FIG. 4B further shows the TE polarization plane and the TM polarization plane of the PL radiation with regard to the substrate surface.

Referring to FIG. 4A, it can be seen that the there occurs a decrease of the PL peak energy with increase of the number of stacks and converges to the value of about 1.5 eV when the number of the stacks has exceeded 20 or 30. It is believed that this represents the existence of quantum-mechanical coupling of the individual quantum dots, which leads to formation of a large quantum dot as a whole from a number of quantum dots thus stacked.

Referring to FIG. 4A, it can be seen that the there occurs a decrease of the PL peak energy with an increase in the number of stacks and converges to the value of about 1.5 eV when the number of the stacks has exceeded 20 or 30. It is believed that this represents the existence of quantum-mechanical coupling of the individual quantum dots, which leads to formation of a large quantum dot as a whole from a number of quantum dots thus stacked.

By further increasing the number of stacks, the PL intensity of the TM mode becomes larger than the PL intensity of the TE mode. In the case the number of stacks has exceeded 15~20, in particular, it can be seen that the TM mode becomes predominant.

Thus, according to the present embodiment, it becomes possible to realize a quantum structure that contains quantum dots free from polarization-dependence or quantum dots having predominant TM-mode preference, by stacking the barrier layers 14 repeatedly together with the quantum dots 13 contained therein with optimized number of the stacks, such that the value of the in-plate strain becomes equal to or larger than the value of the strain perpendicular to the substrate surface ($\epsilon_{zz}-\epsilon_{xx} \leq 0$)

[Second Embodiment]

Figure 5:
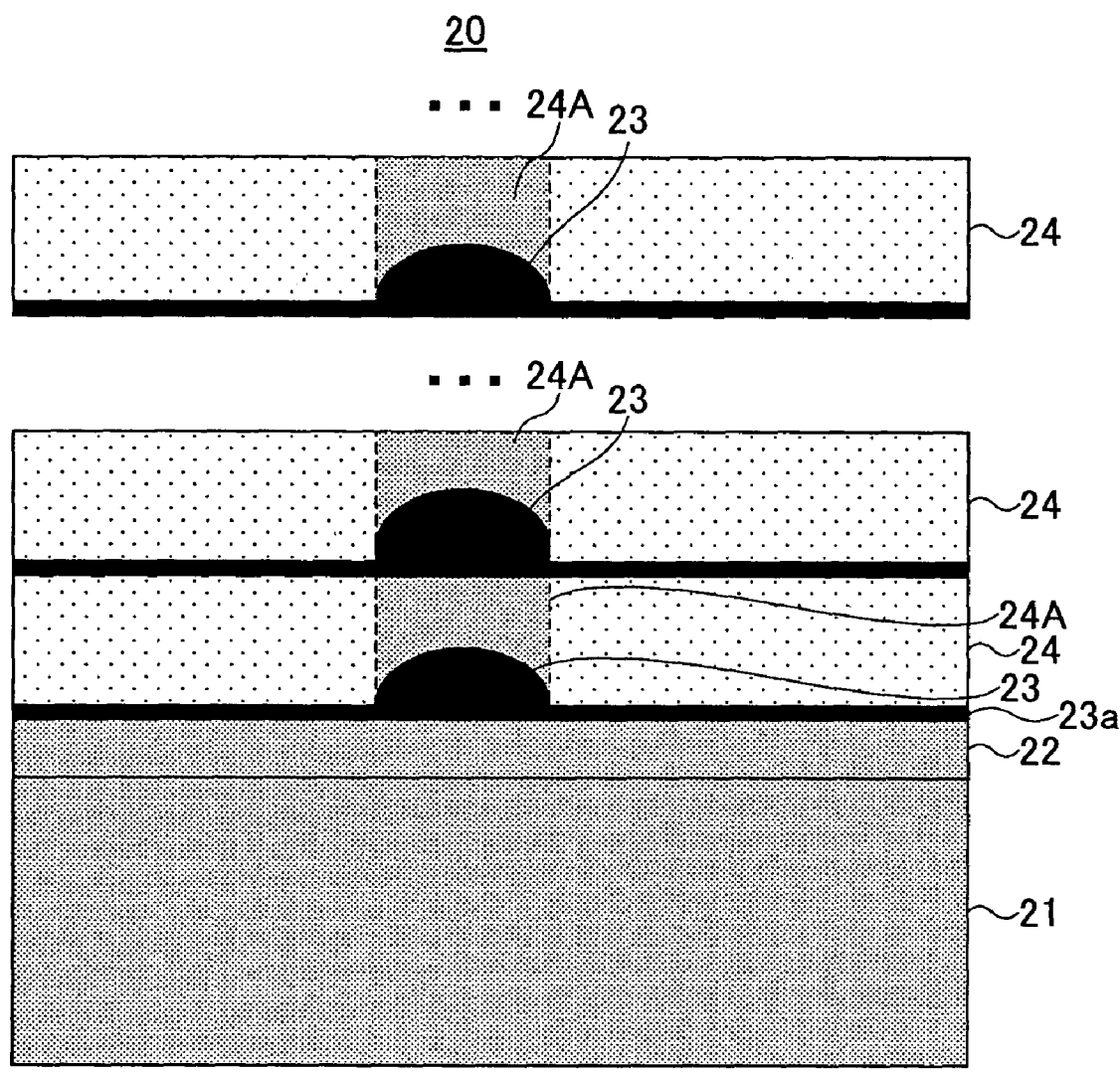
FIG. 5 is a diagram showing the construction of a quantum semiconductor device according to a second embodiment of the present invention.

FIG. 5 shows the construction of a quantum optical semiconductor device 20 according to a second embodiment of the present invention.

Referring to FIG. 5, the quantum optical semiconductor device 20 is constructed on a GaAs substrate of (100)-surface orientation and covered with a buffer layer 22 of GaAs or AlGaAs, wherein the quantum optical semiconductor device 20 further includes a number of InAs quantum dots 23 formed on the buffer layer 22 by an S-K mode growth conducted by using an MOVPE process.

On the surface on which the S-K growth of the InAs quantum dots 23 occurs, it can be seen that there is formed an extremely thin InAs wetting layer 23a. While not illustrated, a similar wetting layer is used also in the embodiment of FIG. 3.

In the present embodiment, the InAs quantum dots 23 can be formed by supplying source gases at the substrate temperature of 510° C., for example, with a supply rate set such that there is caused a growth of InAs layer with a thickness of 1.9 molecular layers. After this, an InGaAs barrier layer 24 is formed epitaxially so as to cover the InAs quantum dots 23 with a composition represented as $In_xGa_{1-x}As$.

Further, by repeating the growth of the quantum dots 23 and the InGaAs layer 24 alternately, the quantum optical semiconductor device 20 of FIG. 5 is obtained.

Figure 6:
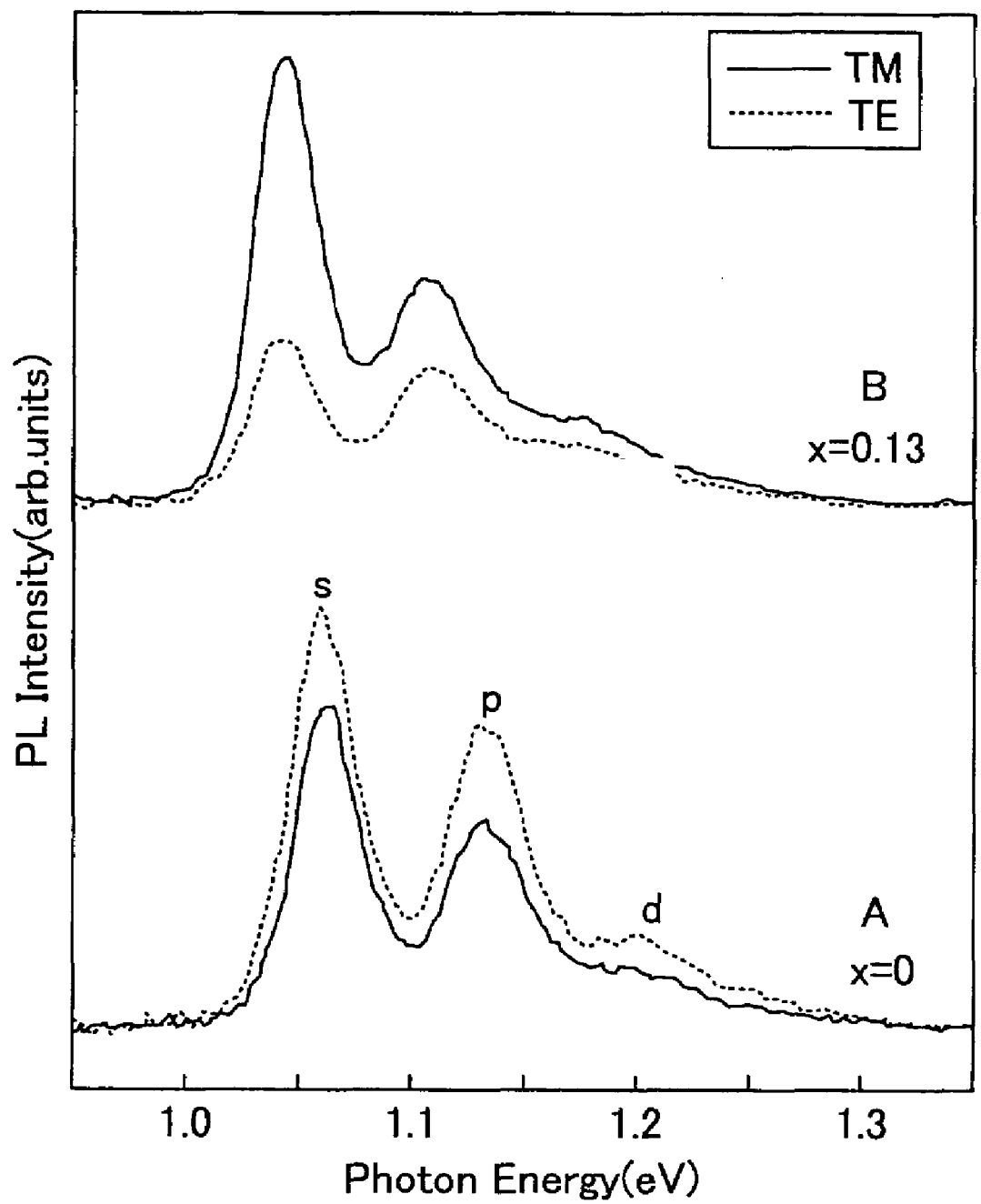
FIG. 6 is a diagram showing the PL spectrum of the semiconductor device of FIG. 5.

FIG. 6 shows an example of the PL spectrum observed for the quantum optical semiconductor device 20 of FIG. 5, wherein it should be noted that Specimen A of FIG. 6 represents the case in which a GaAs layer is used for the barrier layer 24 in place of the InGaAs mixed crystal, while Specimen B represents the case in which an InGaAs mixed crystal having a compositional parameter x of 0.13 (x=0.13) is used for the InGaAs barrier layer 24. In FIG. 6, "s", "p" and "d" represent respectively the optical radiation from the s-shell, p-shell and d-shell, and thus correspond to the fundamental level, first excitation level and second excitation level of the quantum dot, respectively.

Referring to FIG. 6, it can be seen that the PL radiation of TE-mode is predominant over the radiation of TM-mode in the Specimen A, which uses GaAs for the barrier layer 24, for any of the radiation from the s-shell, p-shell and the d-shell, while in the case of the Specimen B that uses InGaAs mixed crystal for the barrier layer 24, it can be seen that the PL radiation of TM-mode becomes predominant.

It is believed that the foregoing result of FIG. 6 indicates that there has been caused an increase of In content, and hence increase of lattice constant, in the barrier layer 24 in a region 24A thereof located immediately above the quantum dot 23 as a result of accumulation of strain in such a region 24A. Associated with the increase of the In concentration in the region 24A, it is believed that there has been caused a corresponding increase of Ga concentration in the part of the barrier layer 24 contacting laterally to the quantum dot 23, leading to local decrease of the lattice constant in such a region.

Figure 7:
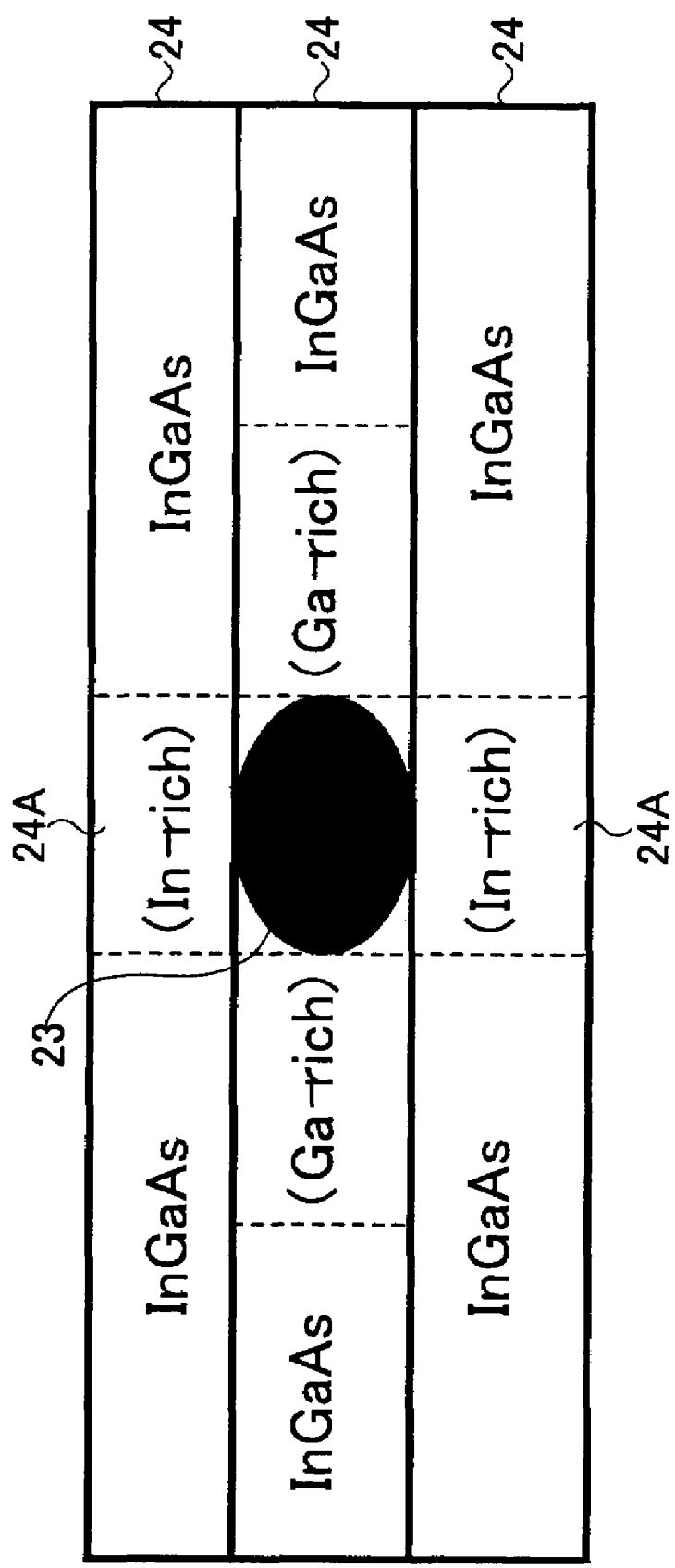
FIG. 7 is a diagram showing the structure appearing in the quantum semiconductor device of FIG. 5.

Thus, the result of FIG. 6 is interpreted as reflecting the local compositional change of the barrier layer 24 taking place in the vicinity of the quantum dot 23 as represented in FIG. 7. It should be noted that FIG. 7 is a schematic diagram showing the region surrounding a single quantum dot 23 of FIG. 5. In FIG. 7, those parts corresponding to the parts described previously are designated by the same reference numerals and the description thereof will be omitted.

Here, it should be noted that the local compositional change caused in the region 24A as shown in FIG. 5 or 7, is induced by a self-organizing process. Thus, there is no need of conducting an external process such as patterning for realizing the structure of FIG. 7.

While the foregoing example describes the use of InGaAs for the barrier layer 24, other mixed crystals such as InGaAsP, InAlGaAs, InAlGaP, and the like, can also be used for the barrier layer 24.

[Third Embodiment]

Figure 8:
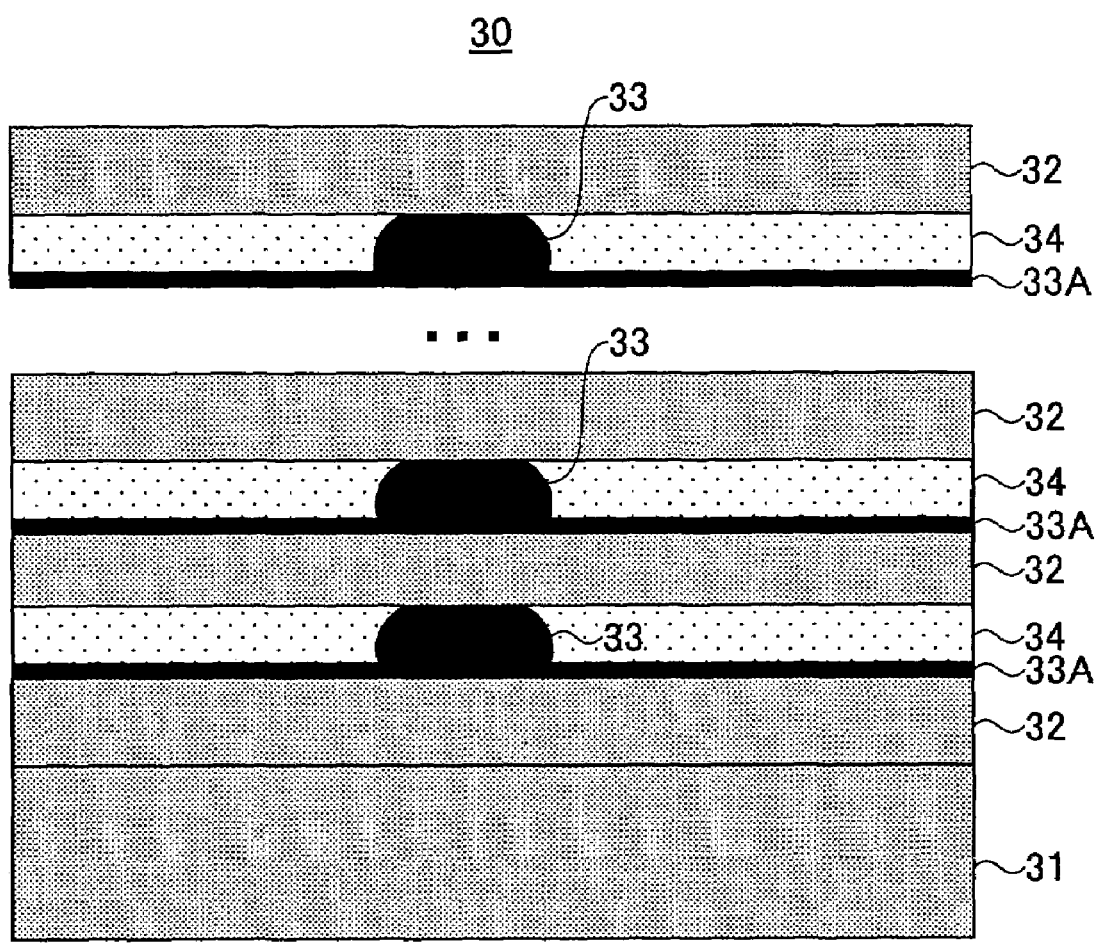
FIG. 8 is a diagram showing the construction of a semiconductor device according to a third embodiment of the present invention.

FIG. 8 shows the construction of a quantum semiconductor device 30 according to a third embodiment of the present invention.

Referring to FIG. 8, there is formed an InGaAsP barrier layer 32 on an InP substrate 31 having a (100) or (311)B surface orientation via an InP buffer layer not illustrated, and quantum dots 33 of undoped InGaAs or InAs are formed on the InGaAsP barrier layer 32 by an S-K growth process that uses an MOVPE process conducted at the substrate temperature of 450–550° C. As a result of such an S-K growth process, there is formed an extremely thin wetting layer 33A on the surface of the InGaAsP barrier layer 32.

Further, the quantum dots 33 are buried by another InGaAsP barrier layer 34 having a composition different from the composition of the InGaAsP barrier layer 32, wherein the barrier layer 32 including therein the quantum dots 33 and the barrier layer 34 are deposited alternately and repeatedly for about 10 cycles. Thereby, the InGaAsP barrier layers 32 and 34 are formed by an MOVPE process at the substrate temperature of 550–650° C.

In the structure of FIG. 8, it should be noted that the barrier layer 32 makes a contact with an apex of the quantum dot 33 located underneath.

Figure 2:
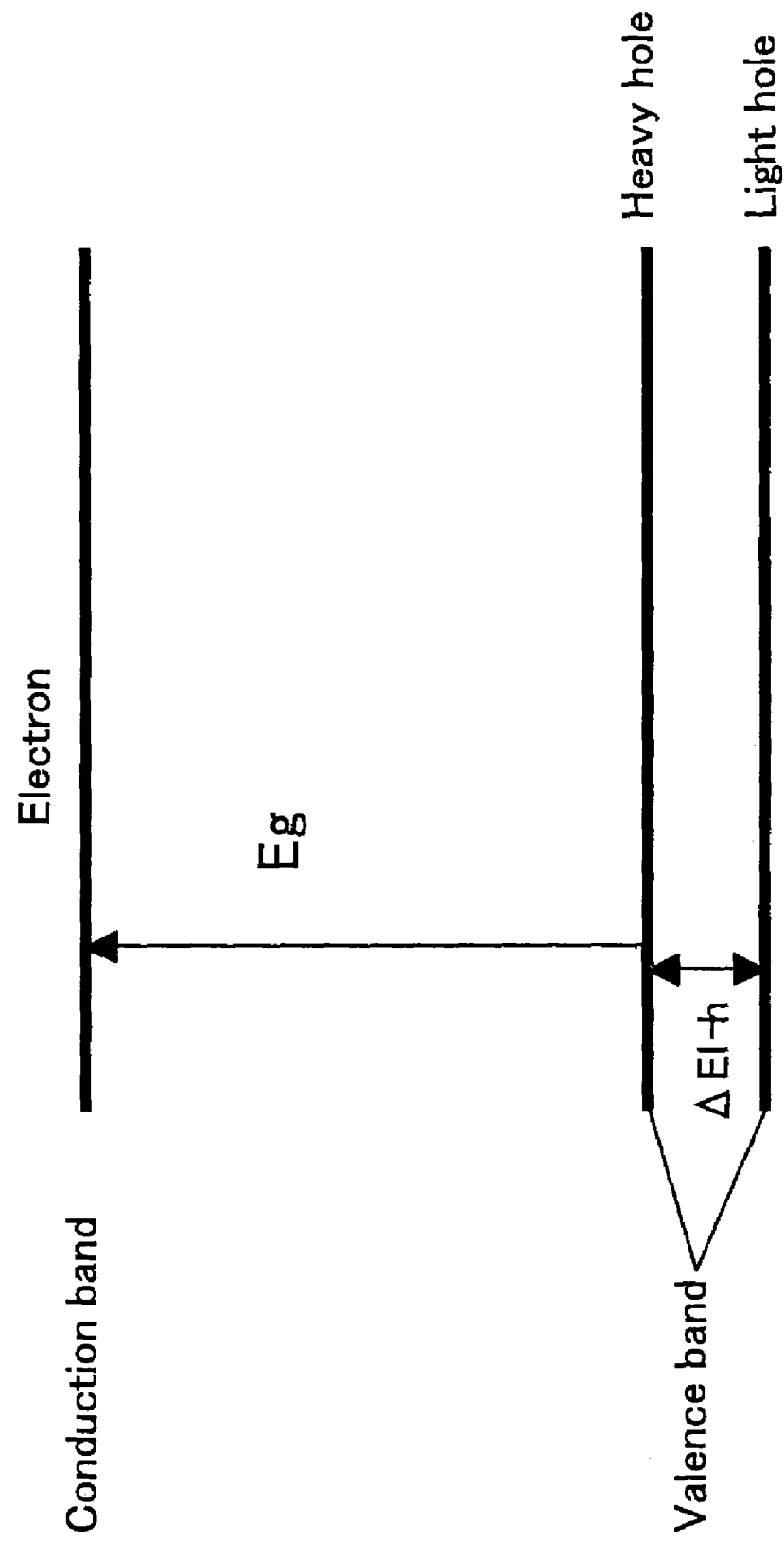
FIG. 2 is a diagram showing the schematic band structure of the quantum dot formed by a conventional S-K mode growth process.
Figure 9:
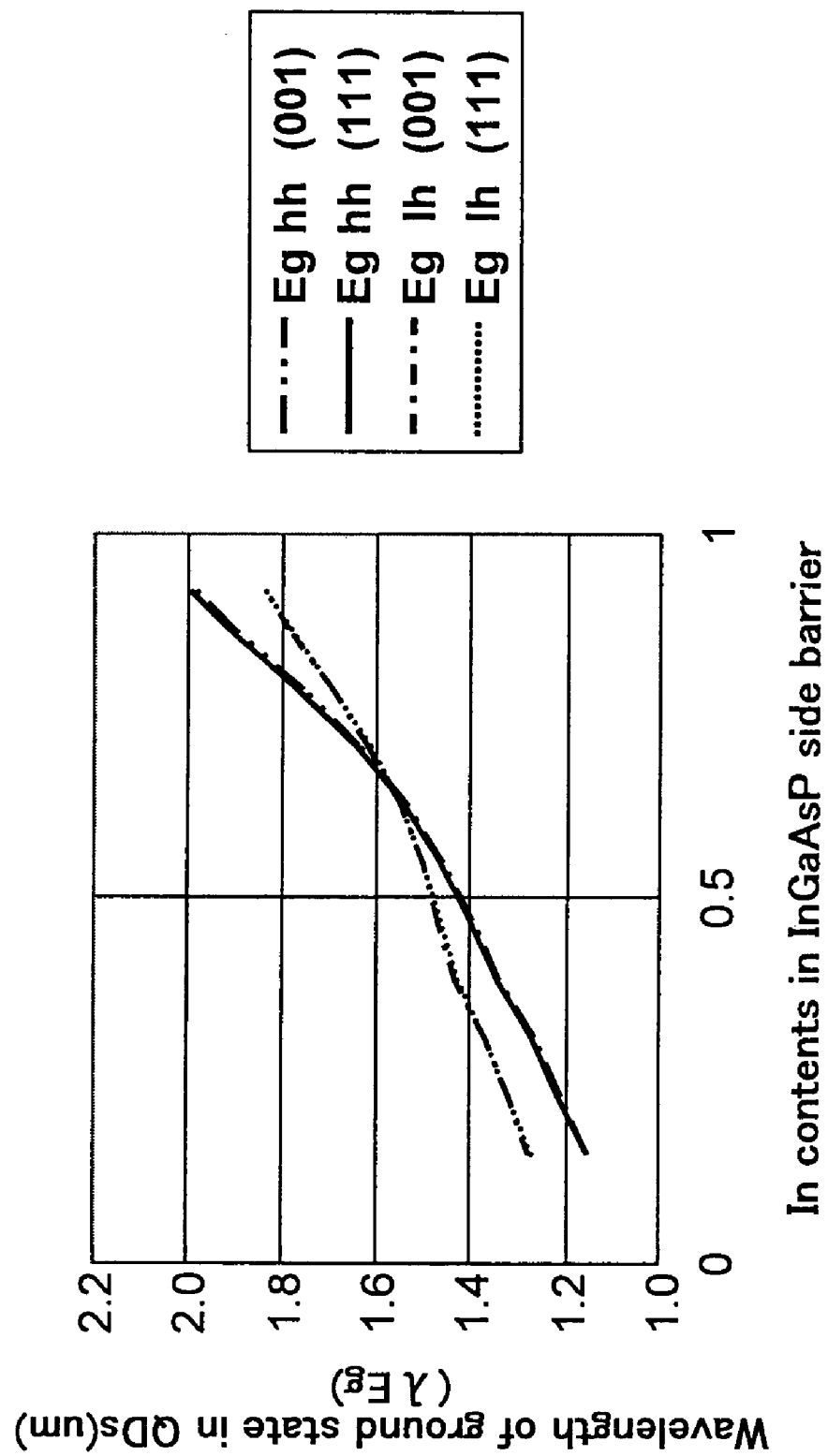
FIG. 9 is a diagram showing the relationship between a wavelength of the quantum dot and the barrier layer composition in the structure of FIG. 8.

FIG. 9 shows the result of calculation of the transition energy Eg (see FIG. 2) for the quantum dot 33 as measured from the fundamental state thereof, wherein the calculation is conducted on the structure of FIG. 8 for the case the quantum dots 33 are formed of InAs and the barrier layer 32 has a lattice-matching composition of $In_{0.717}Ga_{0.283}As_{0.611}P_{0.389}$, while changing the composition of the barrier layer 34, represented by $In_xGa_{1-x}As_yP_{1-y}$, in the range of $0.15 \leq x \leq 0.92$ and $0.5 \leq y \leq 1$. Thereby, it should be noted that the As-composition y is changed with the In-composition x such that the bandgap of the InGaAsP barrier layer 34 is maintained larger than the bandgap of the InAs quantum dot 33. Further, it should be noted that the calculation of FIG. 9 has been conducted by approximating the InAs quantum dot 33 by a rectangular body having a size of 35 nm×35 nm×10 nm. In this structure, the strain components $\epsilon_{xx}$ and $\epsilon_{yy}$ of the quantum dot 33 have the value of −0.0067 ($\epsilon_{xx}$ and $\epsilon_{yy}$=−0.0067). It should be noted that the negative value for the strain components $\epsilon_{xx}$ and $\epsilon_{yy}$ indicates that the quantum dot 33 accumulates therein a compressive in-plane strain.

Referring to FIG. 9, it should be noted that the two-dotted line represents the energy $Eg_{hh}$ (001) required in a quantum dot formed on a (001) surface by the S-K mode growth process for exciting a heavy hole to the conduction band, while the continuous line represents the energy $Eg_{hh}$ (111) required in a quantum dot formed on a (111) surface by the S-K mode growth process for exciting a heavy hole to the conduction band. Further, the one-dotted line represents the energy $Eg_{lh}$ (001) required in a quantum dot formed on a (001) surface by the S-K mode growth process for exciting a light hole to the conduction band, while the dotted line represents the energy $Eg_{lh}$ (111) required in a quantum dot formed on a (111) surface by the S-K mode growth process for exciting a light hole to the conduction band.

Referring to FIG. 9, it can be seen that there is no substantial effect of crystal orientation on the excitation energy Eg in any of the heavy hole and the light hole. On the other hand, FIG. 9 clearly shows that the In content x in the InGaAsP barrier layer 34 provides a profound effect on the excitation energy.

Particularly, it should be noted that the energy difference $\Delta E_{l-h}$ between the heavy hole and the light hole disappears in the case the In content x has the value of about 0.63. In this state, the polarization dependence of the quantum dot 33 disappears. Thus, in this specific composition, the strain component $\epsilon_{zz}$, which acts in the direction perpendicular to the substrate surface, has the value equal to the value of the foregoing strain component $\epsilon_{xx}$ or $\epsilon_{yy}$.

By setting the In composition x to be less than 0.63, the sign of the foregoing energy difference $\Delta E_{l-h}$ is reversed, and the light hole level becomes the fundamental state in the quantum dot 33. Thus, by using such a quantum dot 33, it becomes possible to construct an quantum semiconductor device that interacts with the TM-mode optical radiation.

In the embodiment of FIG. 8, too, it should be noted that there is induced a localized change of composition in the part of the barrier layer 32 and 34 contacting with the quantum dot 33, similarly to the case of FIG. 7.

[Fourth Embodiment]

Figure 10:
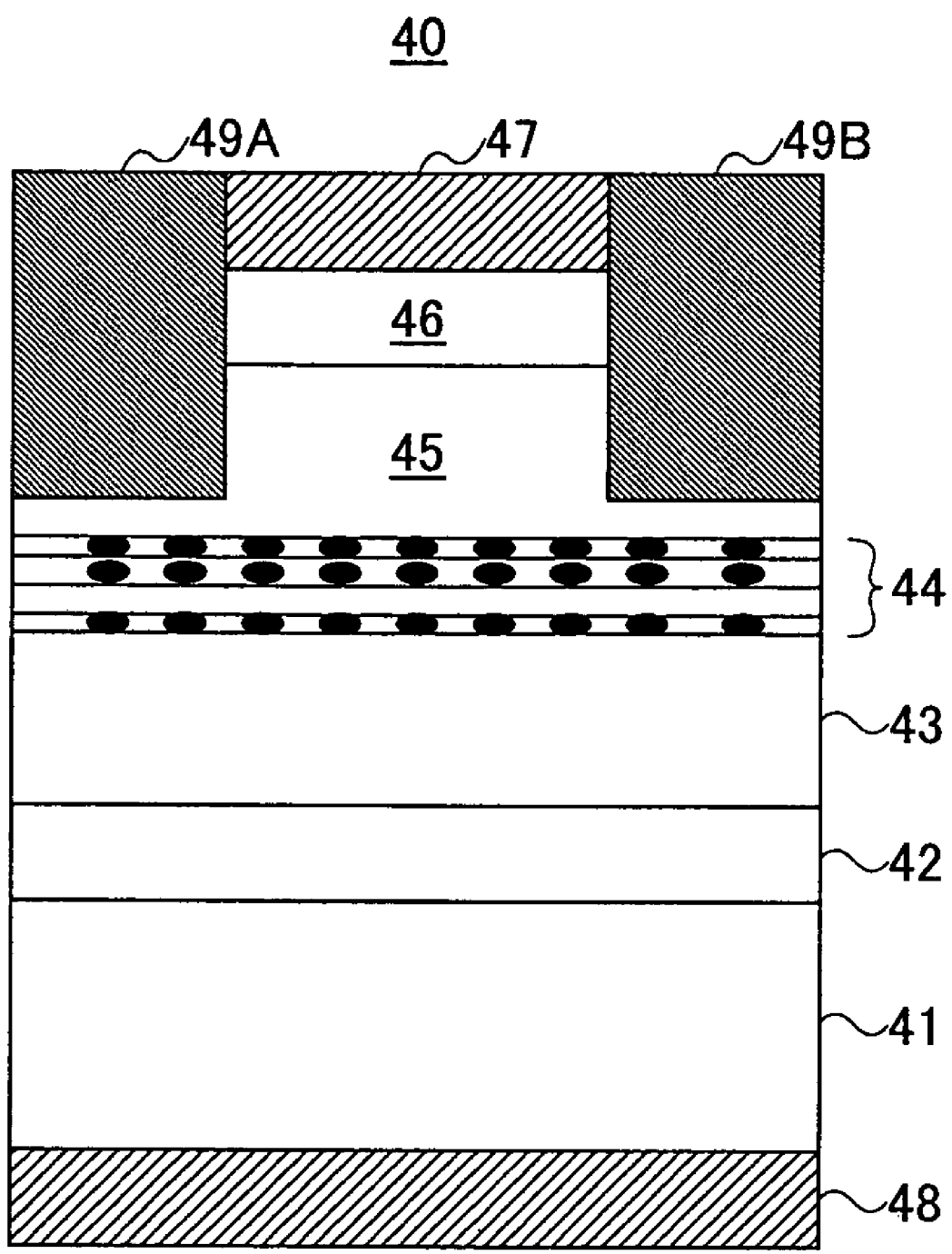
FIG. 10 is a diagram showing the construction of an optical semiconductor device according to a fourth embodiment of the present invention.

FIG. 10 shows the construction of a ridge-guided optical semiconductor device 40 according to a fourth embodiment of the present invention.

Referring to FIG. 10, the optical semiconductor device 40 is constructed on an n-type InP substrate 41 having a (311)B orientation, and there is formed an n-type InP cladding layer 43 on the foregoing n-type InP substrate via an intervening InP buffer layer 42 in an epitaxial relationship with the substrate 41. Typically, the InP substrate 41, the InP buffer layer 42 and the InP cladding layer 43 are doped with a carrier density of about $1 \times 10^{18}$ cm$^{-3}$.

On the cladding layer 43, there are formed a plurality of active layers 44 repeatedly, wherein each of the active layers 44 is formed of the lamination of the InGaAsP barrier layers 32 and 34 as explained in the embodiment of FIG. 8, and the quantum dots 33 are formed in the barrier layer 34. In the present embodiment, the barrier layer 32 may have the composition of $In_{0.717}Ga_{0.283}As_{0.611}P_{0.389}$. Further, the barrier layer 34 may have the composition of $In_{0.63}Ga_{0.37}As_{0.5}P_{0.5}$.

Further, an upper cladding layer 45 of p-type InP is formed on the active layer 44 thus formed, and an upper electrode 47 is provided on the cladding layer 45 via an intervening p-type InP contact layer 46. Further, a bottom electrode 48 is provided on the bottom surface of the InP substrate 41.

In the ridge-guide type optical semiconductor device, it should be noted that the upper cladding layer 45 and the contact layer 46 are patterned to form a ridge structure extending in the axial direction of the device 40, and insulation films 49A and 49B of low refractive index such as SiO$_2$ or polyimide are formed so as to support the ridge structure at both lateral sides thereof.

As a result, the optical radiation formed in the active layer 44 is guided along the ridge structure and induces stimulated emission therein. Thus, by providing mirrors at both end surfaces of the active layer 44, the device 40 functions as a laser diode. Further, it is possible to construct an optical amplifier by not forming such mirrors.

It should be noted that, in such an optical semiconductor device 40, a polarization-free operation is realized by setting the compositions of the barrier layer 32 and the barrier layer 34 as noted before. Further, by setting the In content of the barrier layer 32 to be less than 0.63, it becomes possible to conduct laser oscillation or optical amplification of TM-mode optical beam. Further, it becomes possible to construct various optical active elements used in an optical network.

In the case an n-type GaAs substrate is used for the substrate 41 in place of the n-type InP substrate, it is possible to use a construction in which the InAs quantum dots 13 and the GaAs barrier layers 14 explained with reference to FIG. 3 are stacked, for the active layer 44. Alternatively, it is possible to use the structure in which the InAs quantum dots 23 and the InGaAs barrier layers 24 explained with reference to FIG. 5 are stacked for the active layer 44.

[Fifth Embodiment]

Figure 11:
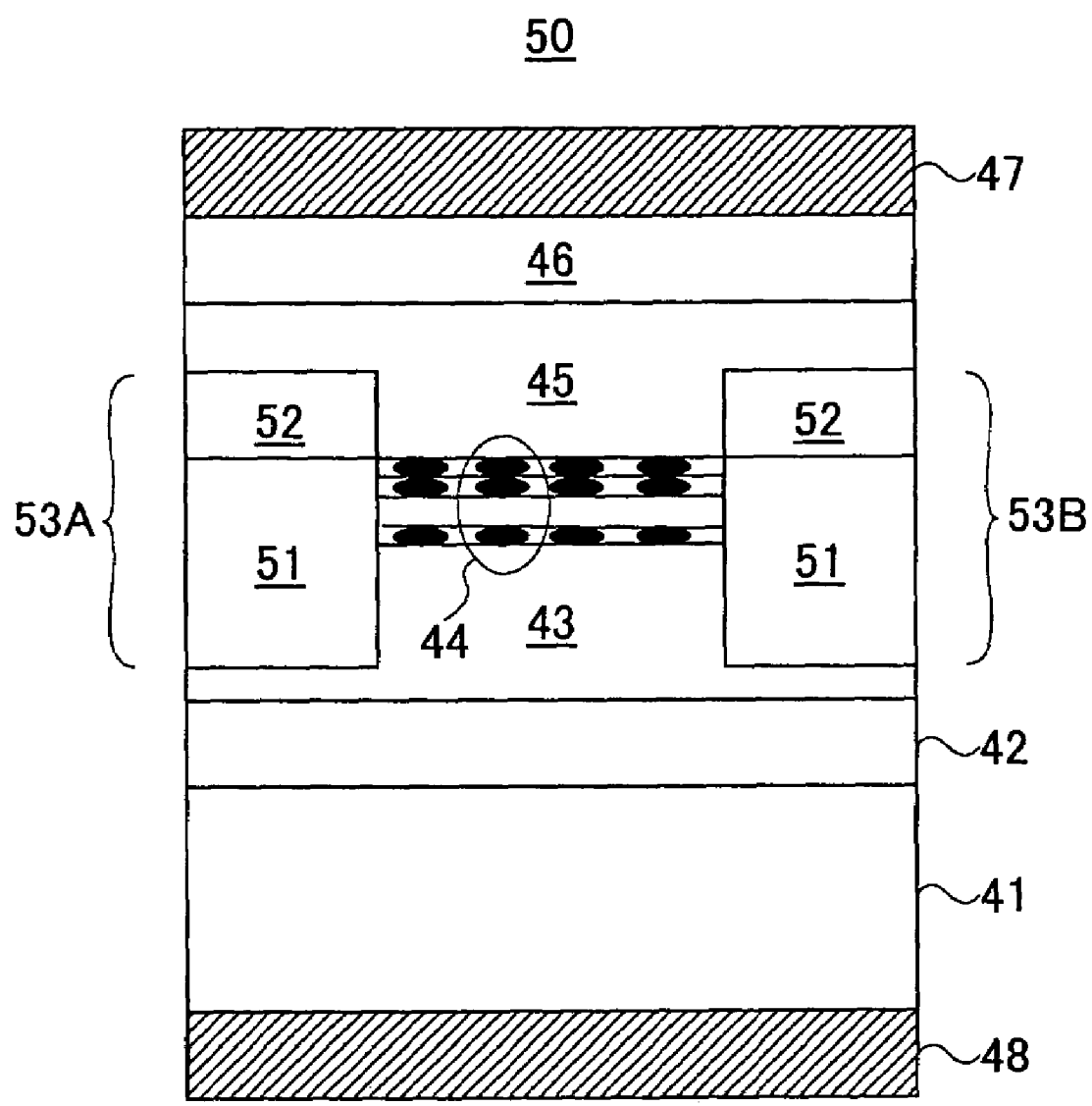
FIG. 11 is a diagram showing the construction of an optical semiconductor device according to a fifth embodiment of the present invention.

FIG. 11 shows the construction of an optical semiconductor device 50 according to a fifth embodiment of the present invention, wherein those parts corresponding to the parts described previously are designated by the same reference numerals and the description thereof will be omitted.

Referring to FIG. 11, the optical semiconductor device 50 has a stacked structure similar to that of the optical semiconductor device 40 of the previous embodiment, except that there is formed a mesa structure in a part of the upper cladding layer 45 and the active layer 44 such that the mesa structure reaches the lower cladding layer 43, and the mesa structure thus formed is laterally supported by a pair of current blocking structures 53A and 53B each having a stacked structure in which a p-type InP layer 51 and an n-type InP layer 52 are laminated.

In such a construction, too, it is possible to construct a laser diode or optical amplifier free from polarization dependence. Further, it is possible to construct various optical active devices such as optical switches used in an optical network.

[Sixth Embodiment]

FIG. 12 shows an example of a photonic network 60 constructed by using the optical active device of FIG. 10 or FIG. 11.

Referring to FIG. 12, the photonic network 60 is constructed by connecting a number of nodes 62, including nodes 62A and 62B, with each other by using optical fibers 61.

In the example of FIG. 12, it should be noted that the node 62A includes a multiple-wavelength optical amplifier 71 that amplifies optical signals of different wavelengths $\lambda_1$, $\lambda_2$, ... simultaneously. By using the optical active device 40 or 50 of FIGS. 10 or 11 for the multiple-wavelength optical amplifier 71, it becomes possible to realize a polarization-free operation for the optical amplifier 71.

Further, it should be noted that the node 62B includes a wavelength switch for converting the wavelengths $\lambda_1$, $\lambda_2$, ... of the incident optical signals to wavelengths of $\lambda_i$, $\lambda_k$, ... in the output optical signals. By using the optical active device 40 or 50 explained previously for such a purpose, it becomes possible to realize polarization-free wavelength conversion.

Further, the present invention is not limited to the embodiments described previously but various variations and modifications may be made without departing from the scope of the invention.

What is claimed is:

1. A quantum optical semiconductor device, comprising:
a semiconductor substrate; and
an active layer formed on said semiconductor substrate and including therein a quantum structure, said quantum structure comprising:
a first barrier layer of a first semiconductor crystal having a first lattice constant and a first bandgap;
a second barrier layer of a second semiconductor crystal formed epitaxially on said first barrier layer, said second semiconductor crystal having a second lattice constant and a second bandgap;
a plurality of quantum dots formed in said second barrier layer, each of said quantum dots comprising a semiconductor crystal forming a strained system with regard to said first and second semiconductor crystals and having a lattice constant different from said first lattice constant and a bandgap smaller than any of said first and second bandgaps, each of said quantum dots having a height substantially identical with a thickness of said second barrier layer; and
a third barrier layer of a third semiconductor crystal formed on said second barrier layer, said third semiconductor crystal having a lattice constant different from said lattice constant of said semiconductor crystal constituting said quantum dots, said third semiconductor crystal further having a third bandgap larger than said bandgap of said semiconductor crystal forming said quantum dots,
said third barrier layer making a contact with an apex of said quantum dot formed in said second barrier layer,
wherein each of said quantum dots has an in-plane strain equal to or larger than a strain acting in a direction perpendicular to said substrate for the case where a tensile strain is defined to have a positive value and a compressive strain is defined to have a negative value.

2. A quantum optical semiconductor device as claimed in claim 1, wherein said second and third barrier layers form together a continuous, single semiconductor layer.

3. A quantum optical semiconductor device as claimed in claim 1, wherein said first barrier layer has a composition modified in the vicinity of said quantum dots, and wherein said third barrier layer has a composition modified in the vicinity of said quantum dot.

4. A quantum optical semiconductor device as claimed in claim 3, wherein each of said first through third barrier layers is formed of a group III-V mixed semiconductor crystal containing In and Ga, each of said first and third barrier layers having an increased In content in the vicinity of said quantum dot.

5. A quantum optical semiconductor device as claimed in claim 4, wherein said second barrier layer has an increased Ga content in the vicinity of said quantum dots.

6. A quantum optical semiconductor device as claimed in claim 1, wherein each of said first semiconductor crystal, said second semiconductor crystal and said third semiconductor crystal achieved lattice-matching with respect to said semiconductor substrate.

7. A quantum optical semiconductor device as claimed in claim 1, wherein said first and third semiconductor crystals have an identical composition.

8. A quantum semiconductor device as claimed in claim 1, wherein said second lattice constant is larger or smaller than any of said first and third lattice constants.

9. A quantum semiconductor device as claimed in claim 1, wherein each of said first through third semiconductor crystals is selected from the group consisting of an InGaAsP mixed crystal, an InAlGaAs mixed crystal, and an InAlGaP mixed crystal.

10. A quantum semiconductor device as claimed in claim 1, wherein said semiconductor substrate comprises any of InP and GaAs.

11. A quantum semiconductor device as claimed in claim 1, wherein said semiconductor substrate carries a first electrode, a first cladding layer being provided between said semiconductor substrate and said active layer, and a second electrode is provided on said active layer via a second cladding layer.

12. A quantum optical semiconductor device as claimed in claim 1, wherein said quantum structure causes interaction with TM-mode optical radiation and TE-mode optical radiation with respective proportions, said proportion of interaction with a TM-mode optical radiation being equal to or larger than said proportion of interaction with a TE-mode optical radiation.

13. A quantum optical semiconductor device, comprising:
a semiconductor substrate; and
an active layer formed on said semiconductor substrate and including a quantum structure therein,
said quantum structure comprising:
a first barrier layer of a first semiconductor crystal having a first lattice constant and a first bandgap;
a second barrier layer of a second semiconductor crystal formed epitaxially on said first barrier layer, said second semiconductor crystal having a second lattice constant and a second bandgap;
a plurality of quantum dots formed in said second barrier layer, each of said quantum dots comprising a semiconductor crystal forming a strained system with respect to said first and second semiconductor crystals and having a lattice constant different from said first lattice constant and a bandgap smaller than any of said first and second bandgaps, each of said quantum dots having a height substantially equal to a thickness of said second barrier layer,
said first barrier layer and said second barrier layer being stacked alternately such that said first barrier layer makes a contact with an apex of said quantum dots in said second barrier layer,
said first barrier layer and said second barrier layer having respective, different compositions,
wherein each of said quantum dots has an in-plane strain equal to or larger than a strain acting in a direction perpendicular to said substrate for the case where a tensile strain is defined to have a positive value and a compressive strain is defined to have a negative value.

14. A quantum optical semiconductor device as claimed in claim 13, wherein said quantum dots are formed of InAs, and wherein said first and second barrier layers are formed of an InGaAsP mixed crystal.

15. A quantum optical semiconductor device as claimed in claim 14, wherein said first barrier layer has a composition represented by compositional parameters x and y as $In_xGa_{1-x}As_{1-y}$, and wherein said compositional parameter y is set to 0.65 or less.

16. A quantum optical semiconductor device, comprising:
a semiconductor substrate; and
an active layer formed on said semiconductor substrate and including a quantum structure therein,
said quantum structure comprising:
a barrier layer of a first semiconductor crystal having a first lattice constant and a first bandgap;
a plurality of quantum dots formed in said barrier layer, each of said quantum dots comprising a semiconductor crystal forming a strained system with respect to said first semiconductor crystal and having a lattice constant different from said first lattice constant and a bandgap smaller than said first bandgap,
said barrier layer containing therein said plurality of quantum dots being stacked for a predetermined stack number,
wherein said predetermined stack number is set such that a proportion of interaction of said quantum dots to optical radiation of TM-mode is equal to or larger than a proportion of interaction of said quantum dots to optical radiation of TE-mode.

17. A quantum optical semiconductor device as claimed in claim 16, wherein said barrier layer has a thickness exceeding a height of said quantum dots.

18. A quantum optical semiconductor device as claimed in claim 16, wherein said semiconductor substrate and said barrier layer are formed of GaAs, said quantum dots are formed of InAs, and wherein said predetermined stack number is about eight.

* * * * *